(12) United States Patent
Kim (10) Patent No.: US 10,651,339 B2
(45) Date of Patent: May 12, 2020

(54) LIGHT EMITTING ELEMENT AND DISPLAY DEVICE INCLUDING THE SAME

(71) Applicant: SAMSUNG DISPLAY CO., LTD., Yongin-si, Gyeonggi-do (KR)

(72) Inventor: Dong Chan Kim, Gunpo-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/455,464

(22) Filed: Mar. 10, 2017

(65) Prior Publication Data
US 2017/0271552 A1      Sep. 21, 2017

(30) Foreign Application Priority Data
Mar. 15, 2016    (KR) .................. 10-2016-0031087

(51) Int. Cl.
| | |
|---|---|
| H01L 33/06 | (2010.01) |
| H01L 27/12 | (2006.01) |
| H01L 27/15 | (2006.01) |
| H01L 27/32 | (2006.01) |
| H01L 33/00 | (2010.01) |
| H01L 33/14 | (2010.01) |
| H01L 33/26 | (2010.01) |
| H01L 51/50 | (2006.01) |

(52) U.S. Cl.
CPC .......... *H01L 33/06* (2013.01); *H01L 27/1214* (2013.01); *H01L 27/156* (2013.01); *H01L 27/3248* (2013.01); *H01L 33/002* (2013.01); *H01L 33/14* (2013.01); *H01L 33/26* (2013.01); *H01L 51/502* (2013.01); *H01L 27/3244* (2013.01); *H01L 51/506* (2013.01); *H01L 51/5076* (2013.01)

(58) Field of Classification Search
CPC .... H01L 33/06; H01L 51/502; H01L 27/3248
See application file for complete search history.

(56) References Cited

U.S. PATENT DOCUMENTS

| | | | |
|---|---|---|---|
| 2005/0006656 A1* | 1/2005 | Jain ................ | B82Y 20/00 257/88 |
| 2008/0217602 A1* | 9/2008 | Kahen ............. | H01L 33/18 257/13 |
| 2009/0278141 A1* | 11/2009 | Coe-Sullivan ... | B82Y 20/00 257/89 |
| 2011/0291071 A1 | 12/2011 | Kim et al. | |

(Continued)

FOREIGN PATENT DOCUMENTS

| | | |
|---|---|---|
| KR | 10-2012-0039940 A | 4/2012 |
| KR | 10-2014-0021735 A | 2/2014 |

(Continued)

*Primary Examiner* — Jay C Chang
*Assistant Examiner* — Mikka Liu
(74) *Attorney, Agent, or Firm* — Lewis Roca Rothgerber Christie LLP (57) ABSTRACT

A light emitting element includes a first electrode, a second electrode overlapping the first electrode, and an emission layer between the first electrode and the second electrode, the emission layer including quantum dots. The quantum dots include a core and a shell. Each of the core and the shell includes at least two selected from Mg, Zn, Te, Se, and S. When the quantum dots include Mg, a content of Mg in the shell is greater than a content of Mg in the core.

12 Claims, 4 Drawing Sheets

(56) References Cited

U.S. PATENT DOCUMENTS

2013/0295586 A1\* 11/2013 Bartel .................... B82Y 30/00
                                                                435/7.1
2016/0233449 A1\* 8/2016 Murayama ........... C09K 11/565

FOREIGN PATENT DOCUMENTS

KR    10-2014-0121346 A    10/2014
KR    10-2015-0034381 A     4/2015

\* cited by examiner

LIGHT EMITTING ELEMENT AND DISPLAY DEVICE INCLUDING THE SAME

CROSS-REFERENCE TO RELATED APPLICATION

Korean Patent Application No. 10-2016-0031087, filed on Mar. 15, 2016, in the Korean Intellectual Property Office, and entitled: "Light emitting element and display device including the same," is incorporated by reference herein in its entirety.

BACKGROUND

1. Field

Embodiments relate to a light emitting element and a display device including the same.

2. Description of the Related Art

An organic light emitting diode (OLED) display device is a self-emissive display element having advantages of a wide viewing angle, excellent contrast, and a fast response time.

SUMMARY

Embodiments are directed to a light emitting element including a first electrode, a second electrode overlapping the first electrode, and an emission layer between the first electrode and the second electrode, the emission layer including quantum dots. The quantum dots include a core and a shell. Each of the core and the shell includes at least two selected from Mg, Zn, Te, Se, and S. When the quantum dots include Mg, a content of Mg in the shell is greater than a content of Mg in the core.

The core may include at least one of $Zn_{1-x}Mg_xSe$, $Zn_{1-x}Mg_xS$, and $Zn_{1-x}Mg_xTe$, wherein x is greater than or equal to 0 and less than or equal to 1.

The shell may include at least one of $Zn_{1-y}Mg_yTe$, $Zn_{1-y}Mg_ySe$, and $Zn_{1-y}Mg_yS$, wherein y is greater than or equal to 0 and less than or equal to 1.

The light emitting element may further include a hole transport layer between the first electrode and the emission layer, the hole transport layer including a compound comprising a p-type dopant.

The hole transport layer may include at least one of p-CuI, p-TlI, p-AgI, p-CdI$_2$, p-HgI$_2$, p-SnI$_2$, p-PbI$_2$, p-BiI$_3$, p-ZnI$_2$, p-MnI$_2$, p-FeI$_2$, p-CoI$_2$, p-NiI$_2$, p-AlI$_3$, p-In$_2$S$_3$, p-Cu$_2$S, p-Ag$_2$S, p-ZnO, p-ZnTe, p-ZnSe, and p-ZnS.

The p-type dopant may include at least one of a metal and a halogen element.

The hole transport layer may include a same compound as the core and the p-type dopant.

The light emitting element may further include an electron transport layer between the emission layer and the second electrode.

The electron transport layer may include at least one selected from a Group I-VI compound including an n-type dopant compound, a Group II-VI compound including an n-type dopant compound, and a Group III-VI compound including an n-type dopant compound.

Embodiments are also directed to a light emitting element including a first electrode, a second electrode overlapping the first electrode, and an emission layer between the first electrode and the second electrode, the emission layer including quantum dots. The quantum dots include a core including at least two selected from Zn, Te, Se, and S, and a shell including at least two selected from Mg, Te, Se, and S.

The light emitting element may further include a hole transport layer between the first electrode and the emission layer, the hole transport layer including a compound including a p-type dopant The hole transport layer may include at least one of p-CuI, p-TlI, p-AgI, p-CdI$_2$, p-HgI$_2$, p-SnI$_2$, p-PbI$_2$, p-BiI$_3$, p-ZnI$_2$, p-MnI$_2$, p-FeI$_2$, p-CoI$_2$, p-NiI$_2$, p-AlI$_3$, p-In$_2$S$_3$, p-Cu$_2$S, p-Ag$_2$S, p-ZnO, p-ZnTe, p-ZnSe, and p-ZnS.

The p-type dopant may include at least one of a metal and a halogen element.

Embodiments are also directed to a display device including a substrate, a thin film transistor on the substrate, a first electrode connected with the thin film transistor, an emission layer on the first electrode, the emission layer including quantum dots, and a second electrode on the emission layer. The quantum dots include a core and a shell. Each of the core and the shell includes at least two selected from Mg, Zn, Te, Se, and S. When the quantum dots include Mg, a content of Mg included in the shell is greater than a content of Mg included in the core.

The core may include at least one of $Zn_{1-x}Mg_xSe$, $Zn_{1-x}Mg_xS$, and $Zn_{1-x}Mg_xTe$, wherein x is greater than or equal to 0 and less than or equal to 1.

The shell may include at least one of $Zn_{1-y}Mg_yTe$, $Zn_{1-y}Mg_ySe$, and $Zn_{1-y}Mg_yS$, wherein y is greater than or equal to 0 and less than or equal to 1.

The display device may further include a hole transport layer between the first electrode and the emission layer, the hole transport layer including a compound including a p-type dopant.

The hole transport layer may include at least one of p-CuI, p-TlI, p-AgI, p-CdI$_2$, p-HgI$_2$, p-SnI$_2$, p-PbI$_2$, p-BiI$_3$, p-ZnI$_2$, p-MnI$_2$, p-FeI$_2$, p-CoI$_2$, p-NiI$_2$, p-AlI$_3$, p-In$_2$S$_3$, p-Cu$_2$S, p-Ag$_2$S, p-ZnO, p-ZnTe, p-ZnSe, and p-ZnS.

The p-type dopant may be a metal or a halogen element.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "between" two layers, it can be the only layer between the two layers, or one or more intervening layers may also be present. Like reference numerals refer to like elements throughout.

Figure 1:
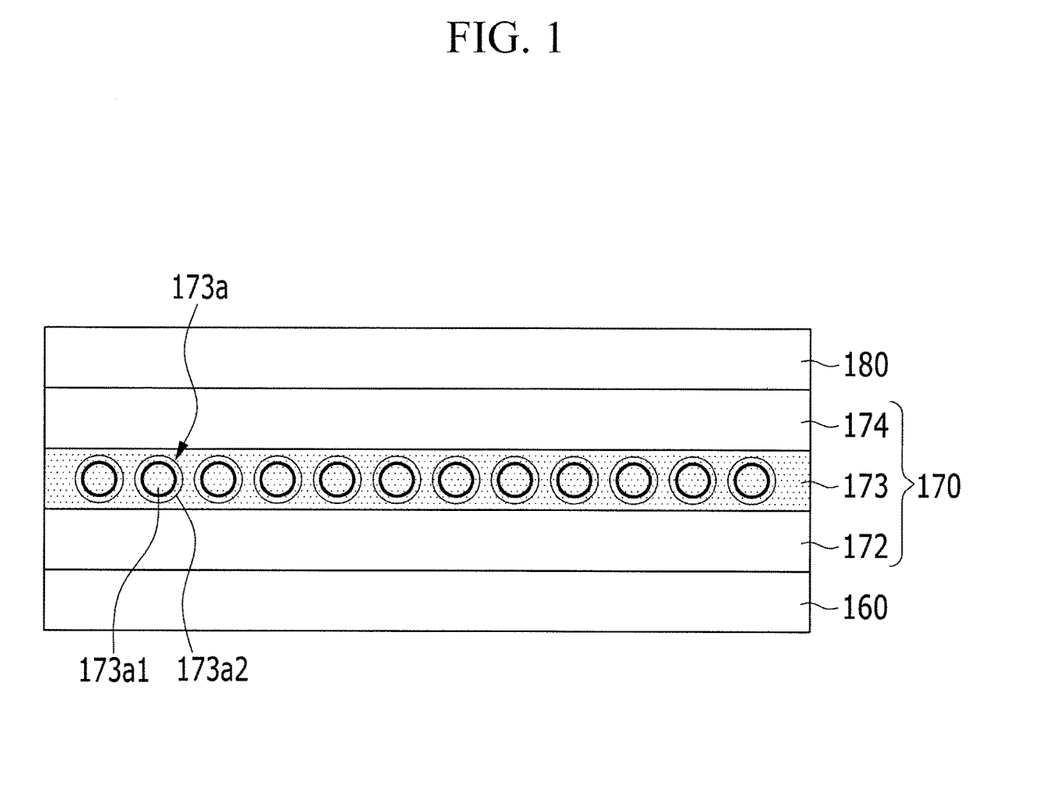
FIG. 1 illustrates a cross-sectional view of a light emitting element according to an exemplary embodiment.
Figure 2:
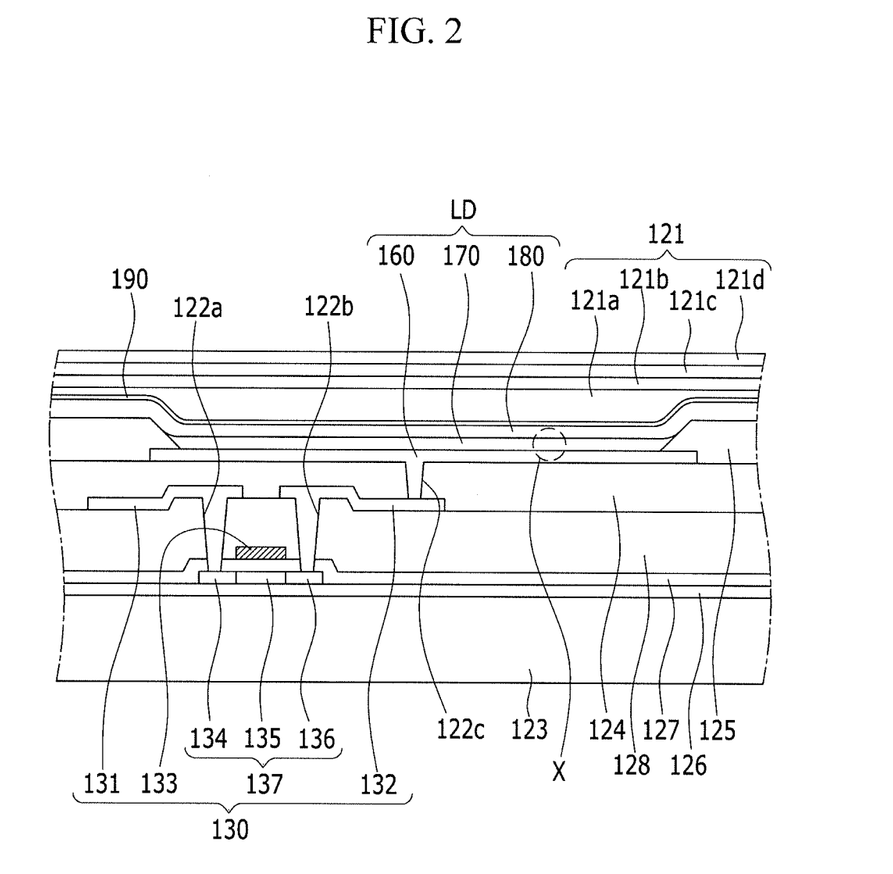
FIG. 2 illustrates a cross-sectional view of a display device according to an exemplary embodiment.

A light emitting element and display device according to an exemplary embodiment will now be described in detail with reference to accompanying drawings. FIG. 1 illustrates a cross-sectional view of a light emitting element according to an exemplary embodiment, and FIG. 2 illustrates a cross-sectional view of a display device according to an exemplary embodiment. Although the structure of the display device shown in FIG. 2 includes a driving thin film transistor and a light emitting element, the structure of the display device may further include a switching thin film transistor, a signal line, and the like.

Referring to FIG. 1, the light emitting element according to an exemplary embodiment may have a structure in which a first electrode 160, a hole transporting layer 172, an emission layer 173, an electron transporting layer 174, and a second electrode 180 are sequentially stacked. As will be described below, the hole transport layer 172, the emission layer 173, and the electron transport layer 174 form the light emitting element layer 170 illustrated in FIG. 2.

When the first electrode 160 is an anode, the first electrode 160 may include a material having a high work function for easy hole injection.

The first electrode 160 may be a transparent electrode. The first electrode 160 may be formed of a conductive oxide such as indium tin oxide (ITO), indium zinc oxide (IZO), zinc tin oxide (ZTO), copper indium oxide (CIO), copper zinc oxide (CZO), gallium zinc oxide (GZO), aluminum zinc oxide (AZO), tin oxide ($SnO_2$), zinc oxide (ZnO), or a combination thereof, a metal such as calcium (Ca), ytterbium (Yb), aluminum (Al), silver (Ag), and magnesium (Mg), or a conductive polymer such as graphene, carbon nanotubes, or PEDOT:PSS, with a small thickness.

In some implementations, the first electrode 160 may have a structure in which two or more layers are layered.

The hole transport layer 172 may be positioned on the first electrode 160. For example, the hole transport layer 172 may be provided between the first electrode 160 and the emission layer 173. The hole transport layer 172 may serve to inject and transport holes to the emission layer 173 from the first electrode 160.

The hole transport layer 172 may include a compound including a p-type dopant. The p-type dopant may be at least one of a metal and a halogen element.

The hole transport layer 172 may include at least one of p-CuI, p-TlI, p-AgI, p-$CdI_2$, p-$HgI_2$, p-$SnI_2$, p-$PbI_2$, p-$BiI_3$, p-$ZnI_2$, p-$MnI_2$, p-$FeI_2$, p-$CoI_2$, p-$NiI_2$, p-$AlI_3$, p-$In_2S_3$, p-$Cu_2S$, p-$Ag_2S$, p-ZnO, p-ZnTe, p-ZnSe, and p-ZnS, as examples.

The hole transport layer 172 according to an exemplary embodiment may include a compound applied with the p-type dopant, wherein the compound may be the same as that of the core included in the emission layer 173 to be described below.

A hole transport layer applied to a display device generally includes an organic material. An energy level of the hole transport layer that includes the organic material and an energy level of the emission layer might be significantly different from each other. Such an energy level difference between the hole transport layer and the emission layer could interfere with hole injection into the emission layer.

In the display device including quantum dots according to an exemplary embodiment, the hole transport layer 172 may be formed so as to include a p-type dopant in a material having the same or similar energy level as the core included in the light emitting layer, such that hole injection between the hole transport layer 172 and the emission layer 173 may be smoothly performed.

When the holes are smoothly injected, balancing between the electrons and holes combined in the emission layer 173 may be enhanced, thereby improving stability and emission efficiency of the light emitting element.

Although the hole transport layer 172 is illustrated as a single layer structure in FIG. 1, in some implementations, the hole transport layer 172 may be formed as a multilayer where two or more layers are stacked.

The emission layer 173 may be positioned on the hole transport layer 172. The emission layer 173 may include an emission material that displays a specific color. For example, the emission layer 173 may display a basic color such as blue, green, or red, or a combination thereof.

The emission material included in the emission layer 173 may include quantum dots 173*a*. The quantum dots 173*a* included in the emission layer 173 may have a core/shell structure where one semiconductor material surrounds another semiconductor material. An interface between the core 173*a*1 and the shell 173*a*2 may have a concentration gradient, such that a concentration of an element existing in the shell 173*a*2 may be gradually reduced nearing the center thereof.

Each of the core 173*a*1 and the shell 173*a*2 may include at least two of Mg, Zn, Te, Se, and S. A content of Mg included in the shell 173*a*2 may be greater than a content of Mg included in the core 173*a*1.

For example, the band gap energy of the semiconductor increases as the Mg content increases. If the content of Mg included in the shell 173*a*2 is greater than the content of Mg included in the core 173*a*1, the bandgap energy of the shell 173*a*2 is provided in a form that encompasses the band gap energy of the core 173*a*1, such that more stable hole/electron injection is possible.

For example, when the shell 173*a*2 includes more Mg than the core 173*a*1, the shell 173*a*2 has a lower HOMO energy level than that of the core 173*a*1, while the shell 173*a*2 may have a higher LUMO energy level than that of the core 173*a*1. According to the relationship between the core/shell energy levels, it is possible to efficiently inject holes and electrons, thereby increasing the luminous efficiency of the light emitting device.

The core 173*a*1 may include at least one of $Zn_{1-x}Mg_xSe$, $Zn_{1-x}Mg_xS$, and $Zn_{1-x}Mg_xTe$, wherein x is greater than or equal to 0 and less than or equal to 1. The shell 173*a*2 may include at least one of $Zn_{1-y}Mg_yTe$, $Zn_{1-y}Mg_ySe$, and $Zn_{1-y}Mg_yS$, wherein y is greater than or equal to 0 and less than or equal to 1. Mg may be omitted from the core 173*a*1, such that the content of Mg included in the shell 173*a*2 may be greater than the content of Mg included in the core 173*a*1. For example, the core 173*a*1 may be a ZnTe material and the shell 173*a*2 may be MgTe.

When the core 173*a*1 includes at least one of $Zn_{1-x}Mg_xSe$, $Zn_{1-x}Mg_xS$, and $Zn_{1-x}Mg_xTe$, and the shell 173*a*2 includes at least one of $Zn_{1-y}Mg_yTe$, $Zn_{1-y}Mg_ySe$, and $Zn_{1-y}Mg_yS$, the shell 173*a*2 and core 173*a*1 may have similar crystal structures and similar lattice constant values. A similar lattice constant value indicates good matching between the core 173*a*1 and the shell 173*a*2.

For example, when the crystal structures have a zinc blend structure, the lattice constant of ZnTe is 6.103, the lattice constant of MgTe is 6.280, and the lattice constant of CdTe is 6.478. In this case, according to an exemplary embodiment, the difference between the lattice constants of ZnTe (core) and MgTe (shell) may be smaller than the difference between the crystal constants of ZnTe (core) and CdTe (shell), which indicates that the quantum dots 173a according to the exemplary embodiment may be excellent in terms of lattice matching.

An average particle diameter of the core 173a1 of the core/shell quantum dot may be about 2 nm to about 5 nm. An average thickness of the shell 173a2 may be about 3 nm to about 5 nm. Further, the average particle diameter of the quantum dot may be about 2 nm to about 10 nm.

In the aforementioned range, by variously selecting the particle diameter of the core 173a1, the average thickness of the shell 173a2, and the average particle diameter of the quantum dots 173a, light emitting colors of the quantum dots 173a and/or semiconductor characteristics of the quantum dots 173a and the like may be variously changed.

A form of the quantum dots 173a may be one that is generally used in the art. For example, the quantum dots 173a may be in a form of spherical, pyramidal, multi-armed, or cubic nanoparticles, nanotubes, nanowires, nanofibers, and nanoplate-shaped particles.

The quantum dot 173a may further include a ligand that is formed in the surface of the shell 173a2 and chemically bonded thereto. The ligand may include an organic functional group.

The electron transport layer 174 may be provided on the emission layer 173. The electron transport layer 174 may serve to inject and transport electrons to the emission layer 173 from the second electrode 180.

The electron transport layer 174 may include a Group I-VI compound, a Group II-VI compound, a Group III-VI compound, or a combination thereof, which include n-type dopants. As examples, the electron transport layer 174 may include at least one of $n-In_2S_3$, $n-Cu_2S$, $n-Ag_2S$, n-ZnO, n-ZnTe, n-ZnSe, and n-ZnS.

Although the electron transport layer 174 is illustrated as a single layer structure in FIG. 1, in some implementations, the electron transport layer 174 may be formed as a multilayer where two or more layers are stacked.

The second electrode 180 may be provided on the electron transport layer 174. In the display device according to the exemplary embodiment, the first electrode 160 may be an anode and the second electrode 180 may be a cathode. In some implementations, the first electrode 160 may be a cathode and the second electrode 180 may be an anode.

The second electrode 180 may be a transparent electrode. The second electrode 180 may be formed of a conductive oxide such as indium tin oxide (ITO), indium zinc oxide (IZO), zinc tin oxide (ZTO), copper indium oxide (CIO), copper zinc oxide (CZO), gallium zinc oxide (GZO), aluminum zinc oxide (AZO), tin oxide ($SnO_2$), zinc oxide (ZnO), or a combination thereof, a metal such as calcium (Ca), ytterbium (Yb), aluminum (Al), silver (Ag), and magnesium (Mg), or a conductive polymer such as graphene, carbon nanotubes, or PEDOT:PSS, with a small thickness. In some implementations, the second electrode 180 may have a structure in which two or more layers are stacked.

Hereafter, the display device including the above described light emitting element will be described with reference to FIG. 2.

Referring to FIG. 2, a buffer layer 126 may be provided on a substrate 123. The buffer layer 126 may prevent permeation of an impurity and may flatten the surface of the substrate 123 surface.

A semiconductor layer 137 may be provided on the buffer layer 126. The semiconductor layer 137 may be formed with a polysilicon layer.

The semiconductor layer 137 may include a channel region 135 that is not doped with an impurity, a source region 134, and a drain region 136. The source region 134 and the drain region 136 may be disposed at opposite sides of the channel region 135. Each of the source region 134 and the drain region 136 may be doped. The doped ion impurity may be selected depending on the type of a thin film transistor.

A gate insulating layer 127 may be provided on the semiconductor layer 137, and a gate wire including a gate electrode 133 may be provided on the gate insulating layer 127. The gate electrode 133 may overlap at least a part of the semiconductor layer 137, particularly, the channel region 135.

An interlayer insulating layer 128 may be provided on the gate insulating layer 127 and the gate electrode 133. A first contact hole 122a and a second contact hole 122b that overlap the source region 134 and the drain region 136 of the semiconductor layer 137 may be provided in the gate insulating layer 127 and the interlayer insulating layer 128.

Data wires including a source electrode 131 and a drain electrode 132 may be provided on the interlayer insulating layer 128.

The source electrode 131 and the driving drain electrode 132 may be respectively electrically connected with the source region 134 and the drain region 136 of the semiconductor layer 137 through the first contact hole 122a and the second contact hole 122b respectively provided in the interlayer insulating layer 128 and the gate insulating layer 127.

As described, the semiconductor layer 137, gate electrode 133, the source electrode 131, and the drain electrode 132 may form a thin film transistor 130. In some implementations, the configuration of the thin film transistor 130 may be variously modified.

Next, a planarization layer 124 may be provided on the interlayer insulating layer 128 and the data wire. The planarization layer 124 may serve to remove and planarize a step in order to increase emission efficiency of the light emitting element to be provided thereon.

The planarization layer 124 may have a third contact hole 122c overlapping the drain electrode 132.

In some implementations, one of the planarization layer 124 and the interlayer insulating layer 128 may be omitted.

A first electrode 160 included in a light emitting element LD may be provided on the planarization layer 124. The first electrode 160 may be a pixel electrode. The first electrode 160 may be connected with the drain electrode 132 through the third contact hole 122c of the planarization layer 124.

A pixel defining layer 125 having an opening overlapping the first electrode 160 may be provided on the planarization layer 124. The light emitting element layer 170 may be provided for each opening that is included in the pixel defining layer 125. For example, a pixel area in which each light emitting element layer 170 is formed by the pixel defining layer 125 may be defined.

The light emitting element layer 170 may be provided on the first electrode 160. As described with reference to FIG. 1, the light emitting element layer 170 may include the hole transport layer 172, the emission layer 173, and the electron transport layer 174. The configuration of the light emitting element layer 170 may be the same as that described above, and the description thereof will not be repeated.

The second electrode 180 may be provided on the light emitting element layer 170. The second electrode 180 may be a common electrode. The first electrode 160, the light emitting element layer 170, and the second electrode 180 may form the light emitting element LD.

The first electrode 160 and the second electrode 180 may be made of a transparent conductive material or a transflective or reflective conductive material. According to kinds of materials forming the first electrode 160 and the second electrode 180, the display device may be a top emission type, a bottom emission type, or a double-sided emission type.

An overcoat 190 protecting the second electrode 180 may be provided on the second electrode 180.

A thin film encapsulation layer 121 may be provided on the overcoat 190. The thin film encapsulation layer 121 may encapsulate and protect the light emitting element LD and a circuit part provided on the substrate 123 from the external environment.

The thin film encapsulation layer 121 may include organic encapsulation layers 121a and 121c and inorganic encapsulation layers 121b and 121d which are alternately laminated. In FIG. 2, for example, a case where two organic encapsulation layers 121a and 121c and two inorganic encapsulation layers 121b and 121d are alternately laminated to configure the thin film encapsulation layer 121 is illustrated. In some implementations, the structure of the thin film encapsulation layer 121 may be variously modified as necessary.

Figure 3:
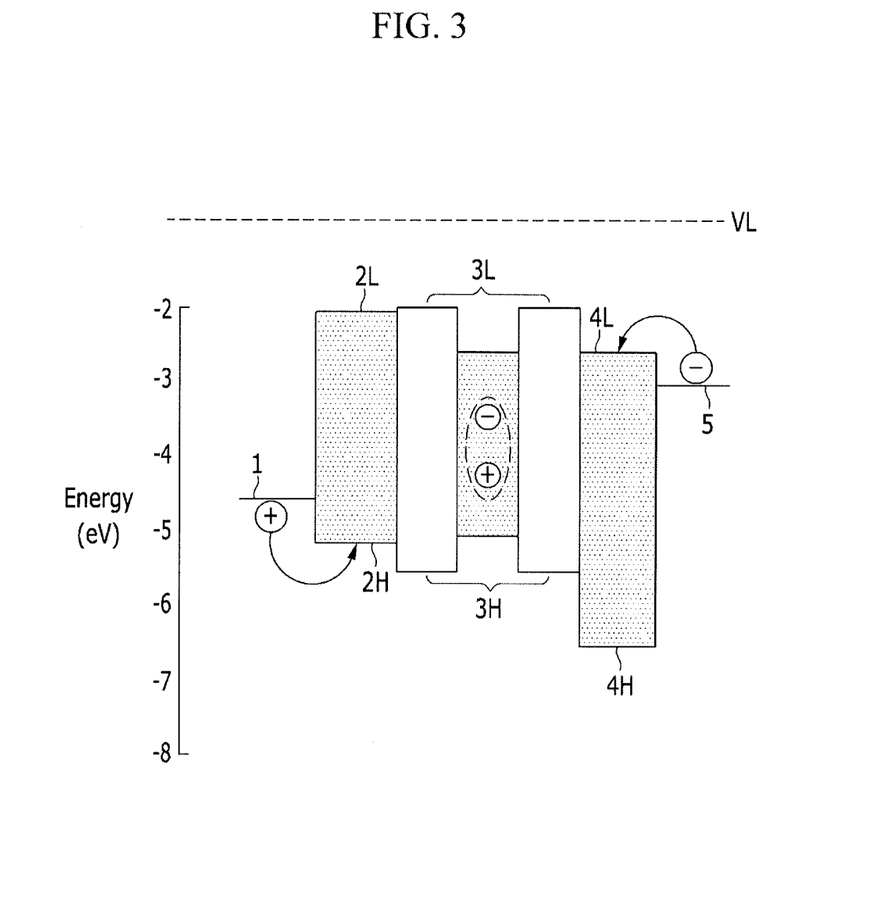
FIG. 3 and FIG. 4 illustrate schematic diagrams illustrating an energy level of each layer of the light emitting element according to the exemplary embodiment.
Figure 4:
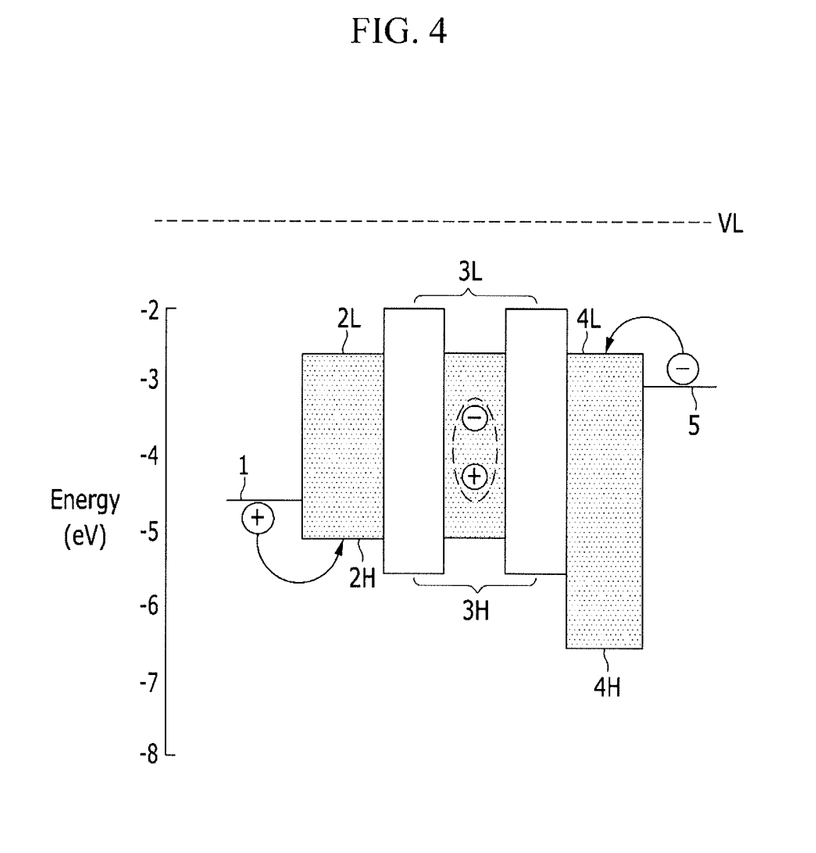

Hereinafter, an energy level of the light emitting element according to the exemplary embodiment will be described with reference to FIG. 3 and FIG. 4. FIG. 3 and FIG. 4 illustrate schematic diagrams that show an energy level of each level of the light emitting element according to the exemplary embodiment.

FIG. 3 illustrates an energy level of the light emitting element of which ITO is applied as the first electrode, p-CuI is applied as the hole transport layer, ZnTe/MgTe is applied as the core/shell of the quantum dots 173a, ZnS is applied as the electron transport layer, and Yb/AgMg is applied as the second electrode. FIG. 4 shows an energy level of s light emitting element that is the same as that of FIG. 3, except that p-ZnTe is applied as the hole transport layer.

Regarding the energy level, an energy level 5 of the second electrode, i.e., the cathode, a HOMO (highest occupied molecular orbital) energy level 4H and a LUMO (lowest unoccupied molecular orbital) energy level 4L of the electron transport layer, a HOMO energy level 3H and a LUMO energy level 3L of the emission layer, a HOMO energy level 2H and a LUMO energy level 2L of the hole transport layer, and an energy level 1 of the first electrode, i.e., the anode, are shown in FIG. 3 and FIG. 4. FIG. 3 and FIG. 4 represent the energy levels (eV) with reference to a vacuum level (VL). The term "work function" refers to the energy required to migrate a charge at a Fermi level to a vacuum level (VL). Therefore, the energy levels shown in FIG. 3 and FIG. 4 are equivalent to the absolute value of a work function.

First, the migration of holes injected to the anode will be described.

Referring to FIG. 3 and FIG. 4, holes are injected from the anode and then reach the HOMO energy level 3H of the emission layer through the HOMO energy level 2H of the hole transport layer.

The hole transport layer and the emission layer (particularly, the core) of the light emitting element according to the present exemplary embodiment include materials that have similar energy levels. Therefore, the HOMO energy level 2H of the hole transport layer and the HOMO energy level 3H of the emission layer, that is, a migration path of the holes, may have similar energy levels. Accordingly holes may smoothly migrate along the migration path.

Referring to the exemplary embodiment shown in FIG. 4, the hole transport layer and the core 173a1 of the quantum dots 173a may include the same compound. Accordingly, each layer having a similar energy level may be provided. For example, the hole may only pass through a shell 173a2 having a thin thickness, so that the migration path may have proper hole injection efficiency.

As described, the hole may sequentially migrate along the anode, the hole transport layer, and the emission layer with such an energy level, and the hole can be injected at a similar level to the electron injection amount. Accordingly, a more efficient light emitting element can be provided.

Next, electron migration from the cathode will be described.

Referring to FIG. 3 and FIG. 4, the electrons may pass through the LUMO energy level 4L of the electron transport layer and reach the LUMO energy level 3L of the emission layer.

As shown in FIG. 3 and FIG. 4, the energy level of the cathode, the LUMO energy level 4L of the electron transport layer, and the LUMO energy level 3L of the core 173a1 of the emission layer, which are a migration path of electrodes, may be similar energy levels, and may have low energy barriers. Accordingly, the electron migration may also be smoothly performed.

Further, referring to FIG. 3 and FIG. 4, in the core/shell forming the emission layer, the LUMO of the shell 173a2 may be greater than the LUMO of the core 173a1, and the HOMO of the shell 173a2 may be less than the HOMO of the core 173a1. For example, the bandgap energy level of the core 173a1 may have a shape being surrounded by the band gap energy level of the shell. According to the energy level relationship between the core 173a1 and the shell 173a2, it may be possible to provide balanced holes and electrons to the emission layer, such that the light emitting efficiency can be increased.

By way of summation and review, an organic light emitting diode (OLED) display device includes an organic light emitting element for light emission. The organic light emitting element forms excitons from combination of electrons injected from one electrode and holes injected from another electrode in an emission layer, and the excitons emit energy such that light is emitted.

However, a general organic light emitting element may have a high driving voltage, high light emission brightness, low luminance and light emission efficiency, and a short lifespan. Holes may not be efficiently injected into the emission layer from the hole transfer, thereby deteriorating a balance between electrons and holes Embodiments provide a light emitting element including quantum dots, and particularly provides a light emitting element having excellent stability and emission efficiency by injecting holes and electrons in balance. Embodiments further provide a display device including the same. When holes and electrons are injected in balance into the emission layer, a light emitting element having excellent luminous efficiency may be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated.

Accordingly, it will be understood by those of skill in the art that various changes in form and details may be made without departing from the spirit and scope thereof as set forth in the following claims.

What is claimed is:

1. A light emitting element, comprising:
   a first electrode;
   a second electrode overlapping the first electrode;
   an emission layer between the first electrode and the second electrode, the emission layer including quantum dots,
   a hole transport layer between the first electrode and the emission layer,
   wherein the quantum dots include a core and a shell,
   the core includes at least two selected from Zn, Te, Se, and S,
   the shell includes Mg and Te,
   a lowest unoccupied molecular orbital (LUMO) energy level of the shell is greater than a LUMO energy level of the core,
   a highest occupied molecular orbital (HOMO) energy level of the shell is less than a HOMO energy level of the core, and
   a HOMO energy level of the hole transport layer is similar to the HOMO energy level of the core.

2. The light emitting element as claimed in claim 1, wherein:
   the core includes at least one of ZnSe, ZnS and ZnTe.

3. The light emitting element as claimed in claim 1, wherein:
   the hole transport layer includes at least one of p-CuI, p-TlI, p-AgI, p-CdI$_2$, p-HgI$_2$, p-SnI$_2$, p-PbI$_2$, p-BiI$_3$, p-ZnI$_2$, p-MnI$_2$, p-FeI$_2$, p-CoI$_2$, p-NiI$_2$, p-AlI$_3$, p-In$_2$S$_3$, p-Cu$_2$S, p-Ag$_2$S, p-ZnO, p-ZnTe, p-ZnSe, and p-ZnS.

4. The light emitting element as claimed in claim 3, wherein:
   the hole transport layer includes a same compound as the core and the p-type dopant.

5. The light emitting element as claimed in claim 1, further comprising an electron transport layer between the emission layer and the second electrode.

6. The light emitting element as claimed in claim 5, wherein:
   the electron transport layer includes at least one selected from a Group I-IV compound including an n-type dopant compound, a Group II-VI compound including an n-type dopant compound, and a Group III-VI compound including an n-type dopant compound.

7. The light emitting element as claimed in claim 5, wherein a LUMO energy level of the electron transport layer is similar to the LUMO energy level of the core.

8. A light emitting element, comprising:
   a first electrode;
   a second electrode overlapping the first electrode;
   an emission layer between the first electrode and the second electrode, the emission layer including quantum dots, and
   a hole transport layer between the first electrode and the emission layer,
   wherein the quantum dots include:
   a core including Zn and Te, and
   a shell including Mg and Te, and
   a lowest unoccupied molecular orbital (LUMO) energy level of the shell is greater than a LUMO energy level of the core,
   a highest occupied molecular orbital (HOMO) energy level of the shell is less than a HOMO energy level of the core, and
   a HOMO energy level of the hole transport layer is similar to the HOMO energy level of the core.

9. The light emitting element as claimed in claim 8, wherein:
   the hole transport layer includes at least one of p-CuI, p-TlI, p-AgI, p-CdI$_2$, p-HgI$_2$, p-SnI$_2$, p-PbI$_2$, p-BiI$_3$, p-ZnI$_2$, p-MnI$_2$, p-FeI$_2$, p-CoI$_2$, p-NiI$_2$, p-AlI$_3$, p-In$_2$S$_3$, p-Cu$_2$S, p-Ag$_2$S, p-ZnO, p-ZnTe, p-ZnSe, and p-ZnS.

10. A display device, comprising:
    a substrate;
    a thin film transistor on the substrate;
    a first electrode connected with the thin film transistor;
    an emission layer on the first electrode, the emission layer including quantum dots;
    a hole transport layer between the first electrode and the emission layer, and
    a second electrode on the emission layer,
    wherein the quantum dots include a core and a shell,
    the core includes at least two selected from Zn, Te, Se, and S, and
    the shell includes Mg and Te,
    a lowest unoccupied molecular orbital (LUMO) energy level of the shell is greater than a LUMO energy level of the core,
    a highest occupied molecular orbital (HOMO) energy level of the shell is less than a HOMO energy level of the core, and
    a HOMO energy level of the hole transport layer is substantially the same as or similar to the HOMO energy level of the core.

11. The display device as claimed in claim 10, wherein: the core includes at least one of ZnSe, ZnS and ZnTe.

12. The display device as claimed in claim 10, wherein: the hole transport layer includes at least one of p-CuI, p-TlI, p-AgI, C—CdI$_2$, p-HgI$_2$, p-SnI$_2$, p-PbI$_2$, p-BiI$_3$, pZnI$_2$, p-MnI$_2$, p-FeI$_2$, p-CoI$_2$, p-NiI$_2$, P—AlI$_3$, p-In$_2$S$_3$, p-Cu$_2$S, p-Ag$_2$S, p-ZnO, p-ZnTe, p-ZnSe and p-ZnS.

* * * * *

UNITED STATES PATENT AND TRADEMARK OFFICE
CERTIFICATE OF CORRECTION

PATENT NO. : 10,651,339 B2  
APPLICATION NO. : 15/455464  
DATED : May 12, 2020  
INVENTOR(S) : Dong Chan Kim Page 1 of 1

It is certified that error appears in the above-identified patent and that said Letters Patent is hereby corrected as shown below:

In the Claims

Column 10, Line 50, Claim 12      Delete "C-CdI$_2$," and Insert -- p-CdI$_2$ --

Column 10, Line 51, Claim 12      Delete "pZnI$_2$," and Insert -- p-ZnI$_2$ --

Column 10, Line 51, Claim 12      Delete "P-AlI$_3$," and Insert -- p-AlI$_3$ --

Signed and Sealed this  
Fourteenth Day of September, 2021

Drew Hirshfeld  
*Performing the Functions and Duties of the*  
*Under Secretary of Commerce for Intellectual Property and*  
*Director of the United States Patent and Trademark Office*